(12) United States Patent
Shim et al.

(10) Patent No.: US 10,540,029 B2
(45) Date of Patent: Jan. 21, 2020

(54) DISPLAY DEVICE WITH OVERLAPPING TOUCH SENSOR IMPROVING TOUCH PERFORMANCE BY DECREASING COUPLING CAPACITANCE GENERATED BETWEEN POWER SUPPLY LINE AND OUTER LINES

(71) Applicant: Samsung Display Co., Ltd., Yongin-si, Gyeonggi-do (KR)

(72) Inventors: Jin Bo Shim, Yongin-si (KR); Kyu Young Kim, Yongin-si (KR); Sun Haeng Cho, Yongin-si (KR); Jung Moo Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 12 days.

(21) Appl. No.: 15/713,009

(22) Filed: Sep. 22, 2017

(65) Prior Publication Data
US 2018/0113545 A1 Apr. 26, 2018

(30) Foreign Application Priority Data
Oct. 21, 2016 (KR) ........................ 10-2016-0137937

(51) Int. Cl.
| | |
|---|---|
| *G06F 3/041* | (2006.01) |
| *G06F 3/044* | (2006.01) |
| *G02F 1/1333* | (2006.01) |
| *G02F 1/1343* | (2006.01) |
| *H01L 27/32* | (2006.01) |

(52) U.S. Cl.
CPC .......... *G06F 3/0412* (2013.01); *G02F 1/1343* (2013.01); *G02F 1/13338* (2013.01); *G02F 1/133345* (2013.01); *G06F 3/044* (2013.01); *G06F 3/0416* (2013.01); *H01L 27/323* (2013.01)

(58) Field of Classification Search
CPC ...... G06F 3/0412; G06F 3/0416; G06F 3/044; G06F 1/13338; G06F 1/133345; G06F 1/1343
See application file for complete search history.

(56) References Cited

U.S. PATENT DOCUMENTS

| | | | |
|---|---|---|---|
| 8,686,308 B2 | 4/2014 | Kuriki | |
| 9,335,881 B2 | 5/2016 | Jeong | |
| 9,372,566 B2 | 6/2016 | Park | |
| 2015/0205418 A1* | 7/2015 | Nam | G06F 3/044 345/174 |
| 2015/0370347 A1* | 12/2015 | Jin | G06F 3/044 345/173 |
| 2016/0224155 A1* | 8/2016 | Kim | G06F 3/044 |
| 2018/0061925 A1* | 3/2018 | Miyanaga | G02F 1/1345 |

\* cited by examiner

*Primary Examiner* — Ryan A Lubit
(74) *Attorney, Agent, or Firm* — Lewis Roca Rothgerber Christie LLP

(57) ABSTRACT

A display device includes a substrate corresponding to a display area in which an image is displayed, and a non-display area at at least one side of the display area, a touch sensing device at the display area, first outer lines electrically connected to the touch sensing device, and located at a first non-display area that is a first portion of the non-display area, second outer lines connecting the first outer lines and the touch sensing device, a plurality of pixels at the display area, a driving circuit at the first non-display area for driving the pixels, and a power supply line electrically connected to the pixels and located at a second non-display area that is a second portion of the non-display area.

20 Claims, 5 Drawing Sheets

DISPLAY DEVICE WITH OVERLAPPING TOUCH SENSOR IMPROVING TOUCH PERFORMANCE BY DECREASING COUPLING CAPACITANCE GENERATED BETWEEN POWER SUPPLY LINE AND OUTER LINES

CROSS-REFERENCE TO RELATED APPLICATION

This application claims priority to, and the benefit of, Korean Patent Application No. 10-2016-0137937, filed on Oct. 21, 2016, in the Korean Intellectual Property Office, the entire disclosure of which is incorporated by reference herein.

BACKGROUND

1. Field

An aspect of the present disclosure relates to a display device.

2. Description of the Related Art

Among display devices, an organic light emitting display device is configured to display an image using organic light emitting diodes (OLEDs) that emit light generated by recombination of electrons and holes. The organic light emitting display device has high response speed, and is driven with low power consumption.

The organic light emitting display device includes pixels configured with the OLEDs, and the pixels are supplied with a power source through a power supply line. The power source includes a first power source ELVDD and a second power source ELVSS.

The display device may also include a touch sensor that includes sensing electrodes and outer lines connected to the sensing electrodes in units of lines.

The power supply line and the outer lines may be provided in a non-display area.

SUMMARY

According to an aspect of the present disclosure, there is provided a display device including a substrate corresponding to a display area in which an image is displayed, and a non-display area at at least one side of the display area, a touch sensing device at the display area, first outer lines electrically connected to the touch sensing device, and located at a first non-display area that is a first portion of the non-display area, second outer lines connecting the first outer lines and the touch sensing device, a plurality of pixels at the display area, a driving circuit at the first non-display area for driving the pixels, and a power supply line electrically connected to the pixels and located at a second non-display area that is a second portion of the non-display area.

The first outer lines might not overlap with the power supply line.

The second outer lines may be connected to the touch sensing device by passing through the second non-display area from the first non-display area.

The second non-display area may be between the first non-display area and the display area.

The power supply line may be between the driving circuit and the pixels.

The driving circuit may include a scan driver for supplying a scan signal to the pixels.

The driving circuit may further include a data driver for supplying a data signal to the pixels, and a timing controller for controlling the scan driver and the data driver.

Each of the pixels may include an active layer on the substrate, a gate insulating layer over the active layer, a gate electrode on the gate insulating layer, a first insulating layer over the gate electrode, a source electrode and a drain electrode on the first insulating layer, a second insulating layer over the source electrode and the drain electrode, an anode electrode on the second insulating layer and connected to the drain electrode, an organic layer on the anode electrode, and a cathode electrode on the organic layer.

The power supply line may be electrically connected to the cathode electrodes of the pixels.

The power supply line may include a same material as, and may be in a same layer as, the source electrode and the drain electrode.

The display device may further include a connection pattern on the second insulating layer, and having a first side connected to the power supply line, and a second side connected to the cathode electrode.

The connection pattern may include a same material as, and may be in a same layer as, the anode electrodes.

The connection pattern and the anode electrodes may be separated from each other.

A portion of the cathode electrode of a pixel that is adjacent the connection pattern may extend to the second non-display area to be electrically connected to the connection pattern.

The display device may further include a power supply for supplying power to the pixels through the power supply line.

The display device may further include an encapsulation layer covering the pixels, wherein the touch sensing device and the first outer lines and the second outer lines are on the encapsulation layer.

The touch sensing device may include first sensing electrodes arranged in a first direction, first bridge patterns connecting adjacent ones of the first sensing electrodes, second sensing electrodes arranged in a second direction crossing the first direction, and second bridge patterns connecting adjacent ones of the second sensing electrodes.

The touch sensing device may be in a mesh form having a structure in which a plurality of conductive lines cross each other.

BRIEF DESCRIPTION OF THE DRAWINGS

Embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the embodiments to those skilled in the art.

DETAILED DESCRIPTION

Figure 1:
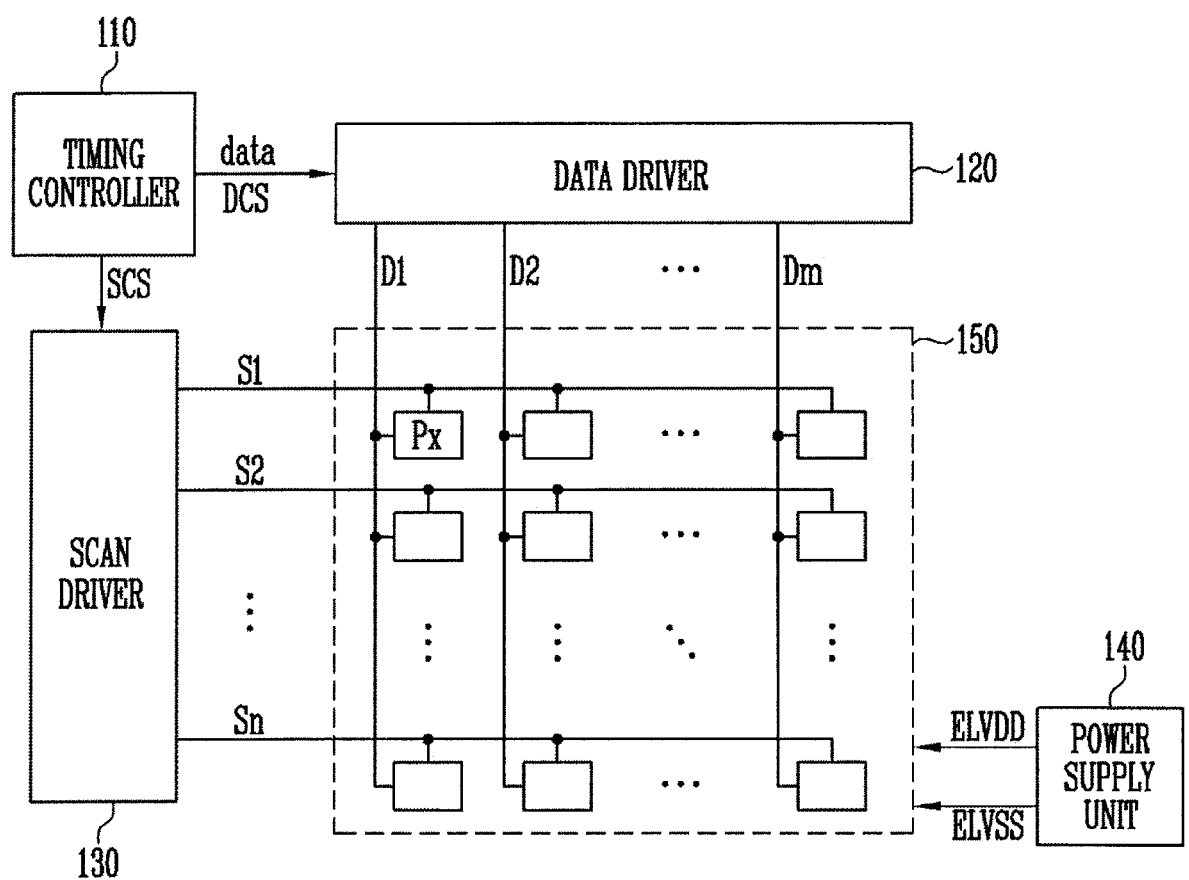
FIG. 1 is a block diagram schematically illustrating a display device according to an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram schematically illustrating a display device according to an embodiment of the present disclosure.

Referring to FIG. 1, the display device according to the present embodiment may include a timing controller 110, a data driver 120, a scan driver 130, a power supply 140, and a pixel area 150.

The timing controller 110 receives image data, and also receives synchronization signals, a clock single, and the like for controlling a display thereof. The timing controller 110 corrects the received image data to be suitable for display of an image on the pixel area 150, and supplies the corrected data signal (data) to the data driver 120. Also, the timing controller 110 outputs a data control signal DCS for controlling a timing operation of the data driver 120, and outputs a scan control signal SCS for controlling a timing operation of the scan driver 130.

The data driver 120 is connected to data lines D1 to Dm, and supplies a data signal to the pixel area 150 through the data lines D1 to Dm. The data driver 120 converts a digital data signal (data) supplied from the timing controller 110 into an analog data signal (or voltage). Specifically, the data driver 120, in response to the data control signal DCS from the timing controller 110, samples and latches the data signal (data), and converts the data signal (data) into a gamma reference voltage to be output.

The scan driver 130 is connected to scan lines S1 to Sn, and supplies a scan signal to the pixel area 150 through the scan lines S1 to Sn. Specifically, the scan driver 130, in response to the scan control signal SCS from the timing controller 110, outputs the scan signal while shifting the level of a gate voltage. In an embodiment, the scan driver 130 may be configured with a plurality of stage circuits, and may sequentially supply the scan signal to the scan lines S1 to Sn.

The power supply 140 applies a high-potential first power source ELVDD and a low-potential second power source ELVSS to the pixel area 150. The power supply 140 may supply the first power source ELVDD and the second power source ELVSS through respective power supply lines. Particularly, the power supply line for supplying the second power source ELVSS will be described in detail later with reference to FIG. 3A.

The pixel area 150 displays an image corresponding to both the data signal supplied from the data driver 120 and the scan signal supplied from the scan driver 130. The pixel area 150 is connected to the scan lines S1 to Sn and the data lines D1 to Dm, and includes a plurality of pixels Px arranged in a matrix form.

Specifically, the pixels Px are selected in units of horizontal lines according to a scan signal supplied to any one of the scan lines S1 to Sn connected to the pixels Px. At this time, each of the pixels Px in a row selected by the scan signal receives a data signal from a respective data line (any one of D1 to Dm) connected thereto. Each of the pixels Px receiving the data signal emits light (e.g., light with a predetermined luminance) corresponding to the data signal.

Each of the pixels Px may be an organic light emitting element including an organic layer. However, the present disclosure is not limited thereto, and the pixel Px may be implemented in various forms, such as a liquid crystal element, an electrophoretic element, and an electrowetting element.

Figure 2:
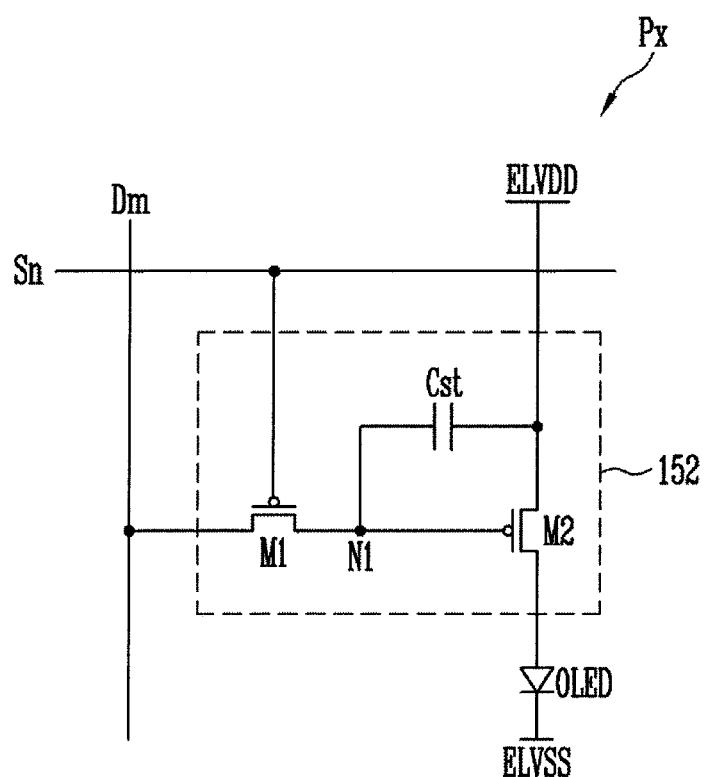
FIG. 2 is a circuit diagram of a pixel shown in FIG. 1.

FIG. 2 is a circuit diagram of a pixel shown in FIG. 1.

Referring to FIG. 2, each of the pixels Px according to the embodiment of the present disclosure may include an organic light emitting diode OLED, a scan line Sn, a data line Dm, a first power source ELVDD, a second power source ELVSS, and a pixel circuit 152 connected to the organic light emitting diode OLED.

An anode electrode of the organic light emitting diode OLED is connected to the pixel circuit 152, and a cathode electrode of the organic light emitting diode OLED is connected to the second power source ELVSS. The organic light emitting diode OLED emits light with a luminance corresponding to the amount of current supplied from the pixel circuit 152.

The pixel circuit 152 may include a first transistor M1, a second transistor M2, and a storage capacitor Cst.

A first electrode of the first transistor M1 is connected to the data line Dm, and a second electrode of the first transistor M1 is connected to a first node N1. In addition, a gate electrode of the first transistor M1 is connected to the scan line Sn. The first transistor M1 is turned on when a scan signal is supplied to the scan line Sn to transmit a data signal supplied from the data line Dm to the first node N1.

A first electrode of the second transistor M2 is connected to the first power source ELVDD, and a second electrode of the second transistor M2 is connected to the anode electrode of the organic light emitting diode OLED. In addition, a gate electrode of the second transistor M2 is connected to the first node N1. The second transistor M2 controls current flowing from the first power source ELVDD to the anode electrode of the organic light emitting diode OLED according to a voltage supplied to the gate electrode thereof.

One terminal of the storage capacitor Cst is connected to the first node N1, and the other terminal of the storage capacitor Cst is connected to the first power source ELVDD and to the first electrode of the second transistor M2. When the scan signal is supplied to the scan line Sn, the storage capacitor Cst stores a voltage corresponding to the data signal supplied to the first node N1, and maintains the storage voltage for one frame.

An operation process of the pixel Px will be described in detail. First, if the scan signal is supplied to the scan line Sn, the first transistor M1 is turned on. If the first transistor M1 is turned on, the data signal supplied to the data line Dm is transmitted to the first node N1 via the first transistor M1. If the data signal is transmitted to the first node N1, a voltage corresponding to the difference between the voltage of the first power source ELVDD and the data signal is charged in the storage capacitor Cst. Then, the second transistor M2 controls current from the first power source ELVDD to the organic light emitting diode OLED according to the voltage supplied to the gate electrode thereof. The organic light emitting diode OLED emits light with a luminance corresponding to the amount of current supplied thereto, thereby displaying an image.

Figure 3A:
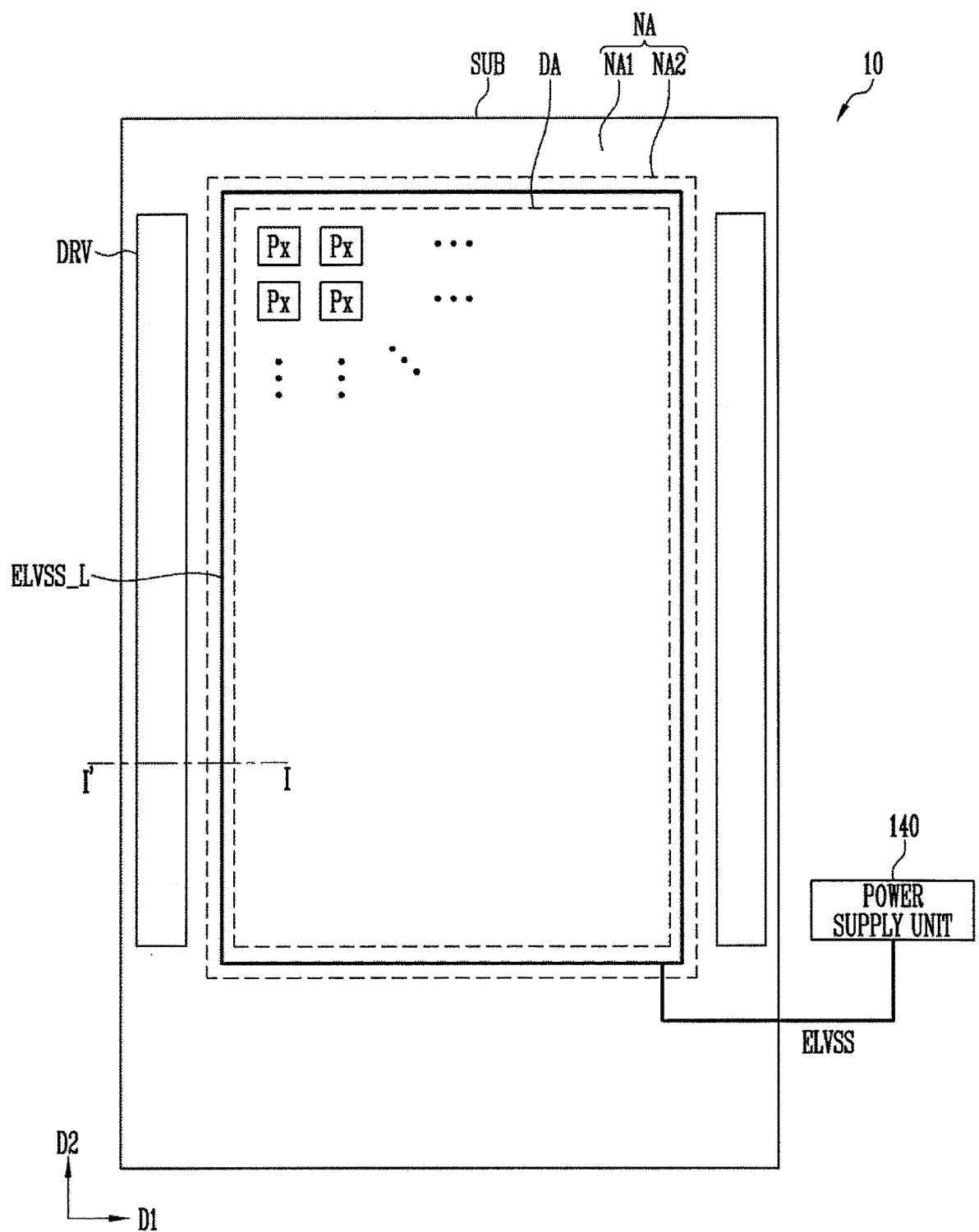
FIG. 3A is a plan view schematically illustrating a display panel in a display device according to an embodiment of the present disclosure.
Figure 3B:
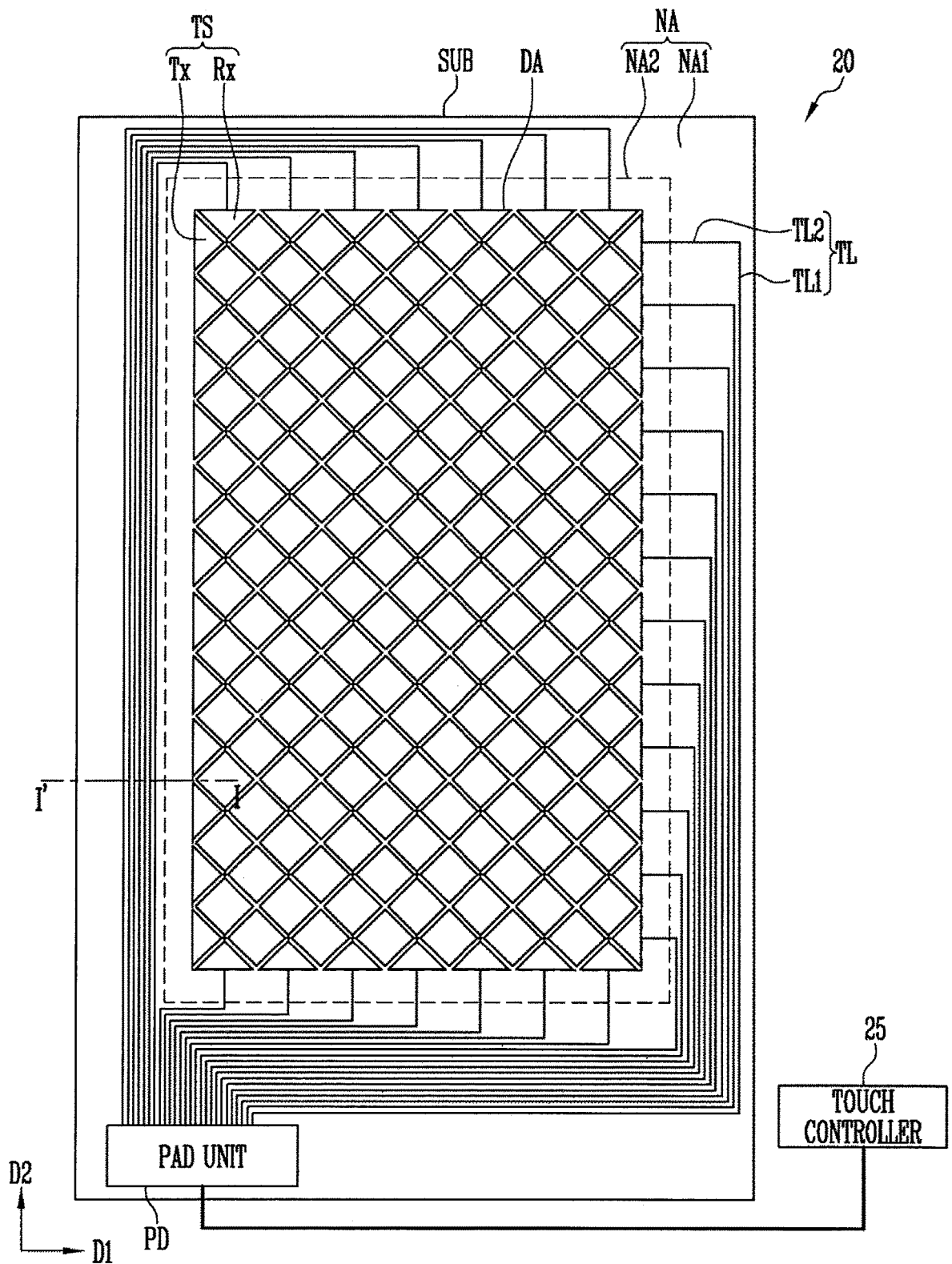
FIG. 3B is a plan view illustrating an embodiment of a touch sensor overlapping with the display panel of FIG. 3A.

FIG. 3A is a plan view schematically illustrating a display panel in a display device according to an embodiment of the present disclosure. FIG. 3B is a plan view illustrating an embodiment of a touch sensor overlapping with the display panel of FIG. 3A.

Referring to FIGS. 3A and 3B, the display device according to the present embodiment includes a display panel 10 and a touch sensor 20 overlapping with the display panel 10.

The display panel 10 includes a substrate SUB, pixels Px provided on the substrate SUB, a power supply line ELVSS_L electrically connected to the pixels Px, and a driving circuit DRV for driving the pixels Px.

The substrate SUB includes a display area DA and a non-display area NA provided at at least one side of the display area DA. The substrate SUB may have an approximately rectangular shape. In the present embodiment, the substrate SUB may include a pair of short sides parallel to each other in a first direction D1 and a pair of long sides parallel to each other in a second direction D2 crossing the first direction D1. However, the shape of the substrate SUB is not limited thereto, and the substrate SUB may have various shapes such as, for example, a closed-shape polygon including linear sides, a circle, an ellipse, etc., including curved sides, and a semicircle, a semi-ellipse, etc., including linear and curved sides.

When the substrate SUB has linear sides, at least one portion of corners of each of the shapes may be formed in a curve (e.g., the shapes may include rounded corners). For example, when the substrate SUB has a rectangular shape, a portion at which adjacent linear sides meet each other may be replaced with a curve (e.g., a curve having a predetermined curvature). That is, a vertex portion of the rectangular shape may be formed with a curved side having adjacent ends respectively connected to one of two adjacent linear sides, the curved side having a predetermined curvature. The curvature may be differently set depending on a position. For example, the curvature may be changed depending on a position at which the curve is started, a length of the curve, etc.

The display area DA is an area in which a plurality of pixels Px are provided to display an image. The display area DA may be provided in a shape corresponding to that of the substrate SUB. For example, like the shape of the substrate SUB, the display area DA may be provided in various shapes, such as a closed-shape polygon including linear sides, a circle, an ellipse, etc., including curved sides, and a semicircle, a semi-ellipse, etc., including linear and curved sides. When the display area DA has linear sides, at least one portion of corners of each of the shapes may be formed in a curve (e.g., the shapes may include rounded corners).

The pixels Px are provided on the display area DA of the substrate SUB. Each pixel Px is a minimum unit for displaying an image, and may be provided in plurality. The pixels Px may emit white light and/or color light. Each pixel Px may emit light of one of red, green, and blue, but the present disclosure is not limited thereto. For example, each pixel Px may emit light of a color such as cyan, magenta, or yellow.

Each pixel Px may be a light emitting element including an organic layer, but the present disclosure is not limited thereto. For example, each pixel Px may be implemented in various forms, such as a liquid crystal element, an electrophoretic element, and an electrowetting element.

In the present embodiment, the pixels Px may be arranged in a matrix form along a plurality of rows to extend in the first direction D1, and along a plurality of columns to extend in the second direction D2. However, the form of the arrangement of the pixels Px is not particularly limited, and the pixels Px may be arranged in various other forms. For example, the pixels Px may be arranged such that one direction becomes the row direction, or may be arranged such that a direction oblique to the one direction becomes the row direction.

The non-display area NA is an area in which no image is displayed, and is an area in which the pixels Px are not provided. The non-display area NA includes a first non-display area NA1 that is a portion of the non-display area NA, and a second non-display area NA2 that is the remaining portion of the non-display area NA. The second non-display area NA2 may be located between the first non-display area NA1 and the display area DA.

In an embodiment, the non-display area NA may have a window frame shape surrounding the display area DA. In addition, the first non-display area NA1 may be an outer area of the non-display area NA, which is in contact with, or aligned with, an edge of the substrate SUB, and the second non-display area NA2 may be an inner area of the non-display area NA, which is in contact with the display area DA. However, the present disclosure is not limited thereto, and the sizes and shapes of the non-display area NA, the first non-display area NA1, and the second non-display area NA2 may be variously modified.

The driving circuit DRV for driving the pixels Px may be provided in the first non-display area NA1. The driving circuit DRV may include at least one of the timing controller 110, the data driver 120, and the scan driver 130, which are described above. The driving circuit DRV may include the scan driver 130 for providing a scan signal to the pixels Px, the data driver 120 for providing a data signal to the pixels Px, the timing controller 110 for controlling the scan driver 130 and the data driver 120, and/or the like.

The driving circuit DRV may be directly mounted on the substrate SUB. When the driving circuit DRV is directly mounted on the substrate SUB, the driving circuit DRV may be formed together with the pixels Px during a process of forming the pixels Px. However, the mounting position and forming method of the driving circuit DRV are not limited thereto. For example, the driving circuit DRV may be formed on a separate chip to be provided in a chip on glass form on the substrate SUB. Alternatively, the driving circuit DRV may be mounted on a separate printed circuit board to be connected to the substrate SUB through a connection member.

The power supply line ELVSS_L for supplying power to the pixels Px is provided in the second non-display area NA2. The power supply line ELVSS_L may supply the second power source ELVSS applied from the power supply 140 to the pixels Px. The power supply line ELVSS_L may be provided in a shape surrounding an entirety of, or a portion of, the display area DA. In an embodiment, the power supply line ELVSS_L may be connected to cathode electrodes of the pixels Px.

As shown in FIG. 3B, the touch sensor 20 may include a touch sensing device TS provided in the display area DA to detect a touch position, outer lines TL located in the first non-display area NA1 and electrically connected to the touch sensing device TS, and a touch controller 25 connected to the touch sensing device TS through the outer lines TL.

In this embodiment, the touch sensing device TS and the outer lines TL are directly formed on an encapsulation layer of the display panel 10. In another embodiment, the touch sensing device TS and the outer lines TL may be adhered in the form of a separate panel or film on the display panel 10. In still another embodiment, the touch sensing device TS and the outer lines TL may be provided in an in-cell type in the display panel 10.

The touch sensing device TS may include first sensing electrodes Tx arranged in the first direction D1, first bridge patterns connecting adjacent first sensing electrodes Tx, second sensing electrodes Rx arranged in the second direction D2 that crosses the first direction D1, and second bridge patterns connecting adjacent second sensing electrodes Rx.

In an embodiment, the first sensing electrodes Tx and the second sensing electrodes Rx are a plurality of conductive patterns for detecting a touch input, and may be disposed to be uniformly distributed in the display area DA. A mutual capacitance is formed between the first sensing electrodes Tx and the second sensing electrodes Rx. When a touch event occurs, the mutual capacitance is changed. In another embodiment, the touch sensing device TS may be configured with self-capacitance sensing electrodes.

The first sensing electrodes Tx and the second sensing electrodes Rx may be formed in the same layer or in different layers. Each of the first sensing electrodes Tx and the second sensing electrodes Rx may be formed in a single layer or in multiple layers. In addition, the first sensing electrodes Tx and the second sensing electrodes Rx may be provided in various shapes, such as a polygonal shape including a bar shape, a diamond shape, etc., or a circular shape.

The first sensing electrodes Tx and the second sensing electrodes Rx may be formed of a transparent electrode material such that light can be transmitted therethrough. For example, the first sensing electrodes Tx and the second sensing electrodes Rx may be made of a transparent conductive material, such as indium tin oxide (ITO), indium zinc oxide (IZO), or antimony zinc oxide (AZO).

In this embodiment, the first bridge patterns have patterns separated from the first sensing electrodes Tx, and may connect adjacent first sensing electrodes Tx in units of lines while being electrically connected to the first sensing electrodes Tx above or below the first sensing electrodes Tx. The second bridge patterns may be integrally formed with the second sensing electrodes Rx in the same layer.

The second bridge patterns may be formed of a transparent electrode material together with the second sensing electrodes Rx. When the second bridge patterns are formed of the transparent electrode material, the second sensing electrodes Rx and the second bridge patterns are integrally patterned from a process of patterning the transparent electrode material, thereby simplifying processes.

In this embodiment, the first sensing electrodes Tx and the second sensing electrodes Rx have a diamond shape. However, the present disclosure is not limited thereto, and the first sensing electrodes Tx and the second sensing electrodes Rx may be selected from shapes, structures, and materials of various conductive patterns known in the art. In an embodiment, the first sensing electrodes Tx and the second sensing electrodes Rx may be provided in a mesh form having a structure in which a plurality of conductive lines cross each other. In this case, the first sensing electrodes Tx and the second sensing electrodes Rx may be made of a conductive metallic material or a conductive nano compound such as silver nano wire (AgNW), carbon nano tube, or graphene.

The outer lines TL are connected, in units of lines, to the first sensing electrodes Tx and to the second sensing electrodes Rx to be electrically connected to the touch controller 25 through a pad (e.g., electronic pad, or pad unit) PD. The pad PD is used to connect the outer lines TL to the touch controller 25, and may be provided at one side of the non-display area NA. The outer lines TL may be connected to the touch controller 25 using a connector, a non-conductive adhesive film, or the like, which may be provided in the pad PD.

The outer lines TL may include first outer lines TL1 located in the first non-display area NA1 and extending along the edge of the substrate SUB, and second outer lines TL2 connecting the first outer lines TL1 to the touch sensing device TS.

First ends of the first outer lines TL1 are connected to the second outer lines TL2, and second ends of the first outer lines TL1 are connected to the pad PD. When viewed on a plane, the first outer lines TL1 may be bent two or more times in the first non-display area NA1.

The first outer lines TL1 are located in the first non-display area NA1. Thus, the first outer lines TL1 do not overlap with the power supply line ELVSS_L located in the second non-display area NA2.

First ends of the second outer lines TL2 are connected to the first sensing electrodes Tx and to the second sensing electrodes Rx, and second ends of the second outer lines TL2 are connected to the first outer lines TL1.

The second outer lines TL2 are connected to the first sensing electrodes Tx and to the second sensing electrodes Rx by passing through the second non-display area NA2 from the first non-display area NA1. Therefore, some of the second outer lines TL2 located in the second non-display area NA2 may overlap with the power supply line ELVSS_L. However, because the second outer lines TL2 extend in a direction that crosses the power supply line ELVSS_L, the overlapping area is very small.

The outer lines TL are disposed in the non-display area NA. Because a wide range of materials may be used as the material of the outer lines TL, the outer lines TL may be formed of not only a transparent electrode material, but also a low-resistance metallic material, such as molybdenum (Mo), silver (Ag), titanium (Ti), copper (Cu), aluminum (Al), or an alloy thereof. In addition, the outer lines TL may be formed in a single layer or in multiple layers. In this case, the outer lines TL may include multiple layers in which two or more of the metallic materials are stacked.

The touch controller 25 detects a variation in capacitance between the first sensing electrodes Tx and the second sensing electrodes Rx, thereby detecting a touch position.

Figure 4:
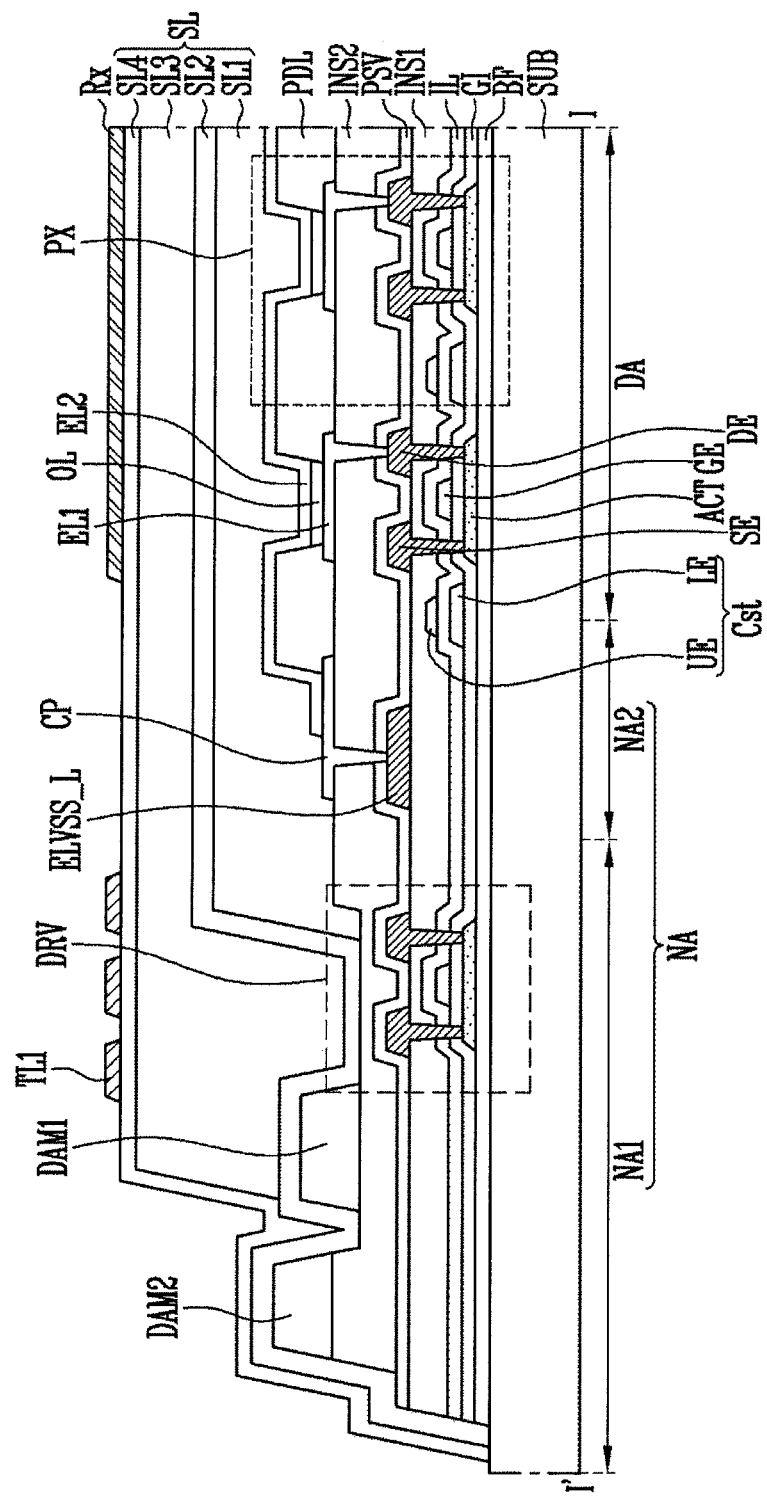
FIG. 4 is a sectional view taken along the line I-I' of FIGS. 3A and 3B.

FIG. 4 is a sectional view taken along the line I-I' of FIGS. 3A and 3B.

Hereinafter, with reference to FIGS. 3A, 3B, and 4, the display area DA will be first described, and the non-display area NA will be described thereafter.

In an embodiment of the present disclosure, a plurality of pixels Px are provided in the display area DA. Each pixel Px includes a transistor connected to a line, such as a scan line or data line, an organic light emitting element connected to the transistor, and a capacitor Cst. The transistor may include a driving transistor for controlling the organic light emitting element, and a switching transistor for switching the driving transistor.

The above-described pixels Px may be implemented in a stack structure as described with reference to FIG. 4. In FIG. 4, for convenience of description, one transistor and one capacitor have been illustrated with respect to one pixel Px, but the present disclosure is not limited thereto. For example, two or more transistors and at least one capacitor may be provided in one pixel Px. Alternatively, three or more transistors and two or more capacitors may be provided in one pixel Px.

The pixels Px according to the present embodiment are provided on a substrate SUB. The substrate SUB may be made of an insulative material, such as glass or resin. Also, the substrate SUB may be made of a material having flexibility to be bendable or foldable. The substrate SUB may have a single-layered structure or a multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and the substrate SUB also may be made of fiber glass reinforced plastic (FRP), or the like.

A buffer layer BF is formed on the substrate SUB. The buffer layer BF reduces or prevents impurities from being diffused in the switching and driving transistors. The buffer layer BF may be an inorganic insulating layer made of an inorganic material. For example, the buffer layer BF may be formed of silicon nitride, silicon oxide, silicon oxynitride, or the like. The buffer layer BF may be omitted according to the material and process conditions of the substrate SUB.

An active pattern ACT is provided on the buffer layer BF. The active pattern ACT is formed of a semiconductor material. The active pattern ACT may include a source region, a drain region, and a channel region provided between the source region and the drain region. The active pattern ACT may be a semiconductor pattern made of poly-silicon, amorphous silicon, semiconductor oxide, or the like. The channel region is a semiconductor pattern undoped with impurities, and may be an intrinsic semiconductor. The source region and the drain region may be semiconductor patterns doped with impurities. The impurities may be impurities such as an n-type impurity, a p-type impurity, and other metals.

A gate insulating layer GI is provided over the active pattern ACT. The gate insulating layer GI may be an inorganic insulating layer made of an inorganic material. The inorganic material may include inorganic insulating materials, such as polysiloxane, silicon nitride, silicon oxide, and silicon oxynitride.

A gate electrode GE and a capacitor lower electrode LE are provided on the gate insulating layer GI. The gate electrode GE is formed to cover a region corresponding to the channel region of the active pattern ACT.

The gate electrode GE and the capacitor lower electrode LE may be made of a metal. For example, the gate electrode GE may be made of one or more metals, such as gold (Au), silver (Ag), aluminum (Al), molybdenum (Mo), chromium (Cr), titanium (Ti), nickel (Ni), neodymium (Nd), and copper (Cu), or alloys thereof. In addition, the gate electrode GE may be formed in a single layer, but the present disclosure is not limited thereto. For example, the gate electrode GE may be formed in multiple layers in which two or more materials among the metals and the alloys are stacked.

In another embodiment of the present disclosure, other lines (e.g., scan lines) may be formed of the same material and in the same layer as the gate electrode GE and the capacitor lower electrode LE. Here, the other lines, such as the scan lines, may be directly or indirectly connected to a portion of the transistor in each pixel Px (e.g., connected to the gate electrode GE).

An interlayer insulating layer IL is provided over the gate electrode GE and the capacitor lower electrode LE. The interlayer insulating layer IL may be an inorganic insulating layer made of an inorganic material. The inorganic material may include polysiloxane, silicon nitride, silicon oxide, silicon oxynitride, and the like.

A capacitor upper electrode UE is provided on the interlayer insulating layer IL. The capacitor upper electrode UE may be made of a metal. For example, the capacitor upper electrode UE may be made of at least one metal, such as gold (Au), silver (Ag), aluminum (Al), molybdenum (Mo), chromium (Cr), titanium (Ti), nickel (Ni), neodymium (Nd), and copper (Cu), or alloys thereof. In addition, the capacitor upper electrode UE may be formed in a single layer, but the present disclosure is not limited thereto. For example, the capacitor upper electrode UE may be formed in multiple layers in which two or more materials among the metals and the alloys are stacked.

The capacitor lower electrode LE and the capacitor upper electrode UE with the interlayer insulating layer IL interposed therebetween constitute the capacitor Cst. In an embodiment of the present disclosure, it has been disclosed that the capacitor Cst is configured to include the capacitor lower electrode LE and the capacitor upper electrode UE. However, the present disclosure is not limited thereto, and the capacitor Cst may be implemented in various manners.

A first insulating layer INS1 is provided over the capacitor upper electrode UE. The first insulating layer INS1 may be an inorganic insulating layer made of an inorganic material. The inorganic material may include polysiloxane, silicon nitride, silicon oxide, silicon oxynitride, and the like.

A source electrode SE and a drain electrode DE are provided on the first insulating layer INS1. The source electrode SE and the drain electrode DE are respectively in contact with the source and drain regions of the active pattern ACT through contact holes formed in the interlayer insulating layer IL and the gate insulating layer GI, respectively.

Each of the source electrode SE and the drain electrode DE may be made of a metal. For example, each of the source electrode SE and the drain electrode DE may be made of at least one metal, such as gold (Au), silver (Ag), aluminum (Al), molybdenum (Mo), chromium (Cr), titanium (Ti), nickel (Ni), neodymium (Nd), and copper (Cu), or alloys thereof. In addition, each of the source electrode SE and the drain electrode DE may be formed in a single layer, but the present disclosure is not limited thereto. For example, each of the source electrode SE and the drain electrode DE may be formed in multiple layers in which two or more materials among the metals and the alloys are stacked.

A passivation layer PSV may be provided over the source electrode SE and the drain electrode DE. The passivation layer PSV may be an inorganic insulating layer made of an inorganic material. The inorganic material may include polysiloxane, silicon nitride, silicon oxide, silicon oxynitride, and the like.

A second insulating layer INS2 may be provided on the passivation layer PSV. The second insulating layer INS2 may be an organic insulating layer made of an organic material. The organic material may include organic insulating materials including a polyacryl-based compound, a polyimide-based compound, a fluorine-based compound, such as Teflon, a benzocyclobutene-based compound, and the like.

An anode electrode EL1 may be provided on the second insulating layer INS2. The anode electrode EL1 is connected to the transistor by being connected to the drain electrode DE through a contact hole passing through the second insulating layer INS2.

In an embodiment of the present disclosure, it has been illustrated that the passivation layer PSV and the second insulating layer INS2 are provided over the drain electrode DE, but the disposition of the insulating layer may be changed. For example, according to an embodiment of the present disclosure, only the passivation layer PSV may be provided over the drain electrode DE, and the anode electrode EL1 may be provided on the passivation layer PSV.

The anode electrode EL1 may be made of a metal layer including silver (Ag), magnesium (Mg), aluminum (Al), platinum (Pt), palladium (Pd), gold (Au), nickel (Ni), neodymium (Nd), iridium (Ir), chromium (Cr), and alloys thereof and/or a transparent conductive layer including tin oxide (ITO), indium zinc oxide (IZO), zinc oxide ZnO, and indium tin zinc oxide (ITZO).

In an embodiment of the present disclosure, the anode electrode EL1 may be made of one kind of metal, but the present disclosure is not limited thereto. For example, the anode electrode EL1 may be made of an alloy of two or more kinds of metals (e.g., silver (Ag) and magnesium (Mg)).

When an image is to be provided toward a lower direction of the substrate SUB, the anode electrode EL1 may be formed of a transparent conductive layer. When an image is to be provided toward an upper direction of the substrate SUB, the anode electrode EL1 may be formed of a metal reflective layer and/or a transparent conductive layer.

A pixel defining layer PDL that defines a pixel region corresponding to each pixel Px is provided on the substrate SUB on which the anode electrode EL1 and the like are formed. The pixel defining layer PDL may be an organic insulating layer made of an organic material. The organic material may include organic insulating materials including a polyacryl-based compound, a polyimide-based compound, a fluorine-based compound such as Teflon, a benzocyclobutene-based compound, and the like.

The pixel defining layer PDL exposes a top surface of the anode electrode EL1 therethrough, and protrudes from the substrate SUB along the circumference of the pixel Px.

An organic layer OL may be provided in the pixel region surrounded by the pixel defining layer PDL. The organic layer OL may include a low-molecular material or a high-molecular material. The low-molecular material may include copper phthalocyanine (CuPc), N,N'-Di(naphthalene-1-yl)-N,N'-diphenyl-benzidine (NPB), tris-8-hydroxyquinoline aluminum ($Alq_3$), and the like. These materials may be formed through vacuum deposition. The high-molecular material may include poly(3,4-ethylenedioxythiophene (PEDOT)-, poly(phenylene-vinylene) (PPV)-, poly(fluorine)-based materials.

The organic layer OL may be formed in a single layer, or may be formed in multiple layers including various functional layers. When the organic layer OL is formed in multiple layers, the organic layer OL may have a structure in which a hole injection layer (HIL), a hole transport layer (HTL), an emission layer (EML), an electron transport layer (ETL), an electron injection layer (EIL), and the like are stacked in a single or complex structure. The organic layer OL may be formed through screen printing, inkjet printing, laser induced thermal imaging (LITI), or the like. However, the organic layer OL is not necessarily limited thereto, and it will be apparent that the organic layer OL may have various structures. In addition, at least a portion of the organic layer OL may be integrally formed throughout a plurality of anode electrodes EL1, or may be individually provided to correspond to each of the plurality of anode electrodes EL1.

A cathode electrode EL2 is provided on the organic layer OL. The cathode electrode EL2 may be provided for every pixel Px. However, the cathode electrode EL2 may be provided to cover a majority of the display area DA, and may be shared by a plurality of pixels Px.

The cathode electrode EL2 may be made of a metal layer including silver (Ag), magnesium (Mg), aluminum (Al), platinum (Pt), palladium (Pd), gold (Au), nickel (Ni), neodymium (Nd), iridium (Ir), chromium (Cr), alloys thereof, and/or a transparent conductive layer including tin oxide (ITO), indium zinc oxide (IZO), zinc oxide ZnO, and/or indium tin zinc oxide (ITZO). In an embodiment of the present disclosure, the cathode electrode EL2 may be formed in two or more layers including a metal thin film. For example, the cathode electrode EL2 may be formed as three layers of ITO/Ag/ITO.

When an image is to be provided in the lower direction of the substrate SUB, the cathode electrode EL2 may be formed of a metal reflective layer and/or a transparent conductive layer. When an image is to be provided in the upper direction of the substrate SUB, the cathode electrode EL2 may be formed of a transparent conductive layer.

An encapsulation layer SL is provided over the cathode electrode EL2. The encapsulation layer SL may be formed in a single layer, or may be formed as multiple layers. In an embodiment of the present disclosure, the encapsulation layer SL may include first to fourth encapsulation layers SL1 to SL4. The first to fourth encapsulation layers SL1 to SL4 may be made of an organic material and/or an inorganic material.

In an embodiment, the first encapsulation layer SL1 may be made of an organic material, the second encapsulation layer SL2 may be made of an inorganic material, the third encapsulation layer SL3 may be made of an organic material, and the fourth encapsulation layer SL4 may be made of an inorganic material. As compared with the organic material, the inorganic material has low permeation of moisture or oxygen, but is weak to cracks due to due to low flexibility. The second and fourth encapsulation layers SL2 and SL4 are formed of the inorganic material, and the first and third encapsulation layers SL1 and SL3 are formed of the organic material, so that the propagation of cracks can be prevented. Here, a layer made of the organic material may be completely covered by a layer made of the inorganic material such that an end portion of the layer made of the organic material is not exposed to the outside. The organic material may include organic insulating materials including a polyacryl-based compound, a polyimide-based compound, a fluorine-based compound such as Teflon, a benzocyclobutene-based compound, and the like. The inorganic material may include inorganic insulating materials such as polysiloxane, silicon nitride, silicon oxide, and silicon oxynitride.

In an embodiment, the organic layer OL constituting light emitting elements may be easily damaged by moisture or oxygen from the outside. The encapsulation layer SL protects the light emitting elements by covering the organic layer OL. The encapsulation layer SL covers the display area DA, and may extend up to the outside of the display area DA. In the case of insulating layers made of an organic material, the insulating layers are advantageous in terms of flexibility, elasticity, and the like. However, as insulating layers made of an inorganic material, moisture or oxygen is more easily permeated into the insulating layers made of the organic material. In an embodiment of the present disclosure, in order to prevent the permeation of moisture or oxygen into the insulating layers made of the organic material, end portions of the insulating layers made of the organic material may be covered by the insulating layers made of the inorganic material so as not to be exposed to the outside.

The number of layers constituting the encapsulation layer SL or the material of the encapsulation layer SL is not limited thereto, and may be variously changed. For example, the encapsulation layer SL may include a plurality of organic material layers and a plurality of inorganic material layers, which are alternately stacked.

A touch sensing device TS (e.g., including the second sensing electrodes Rx) constituting the touch sensor 20 is provided on the encapsulation layer SL. Specifically, the first sensing electrodes Tx and the second sensing electrodes Rx, which correspond to the display area DA, may be located on the encapsulation layer SL.

Next, the non-display area NA will be described. Hereinafter, repeated description of portions or components that have already been described will be omitted or briefly described to avoid redundancy.

The non-display area NA includes a first non-display area NA1 and a second non-display area NA2. The second non-display area NA2 is located between the first non-display area NA1 and the display area DA.

The driving circuit DRV for driving the pixels Px is provided in the first non-display area DA. The driving circuit DRV may include at least one transistor constituting the timing controller 110, the data driver 120, and the scan driver 130, which are described above. For convenience of description, one transistor included in the driving circuit DRV has been illustrated in FIG. 4. However, the present disclosure is not limited thereto, and the driving circuit DRV may include a plurality of transistors and other elements. The sectional structure of the transistor included in the driving circuit DRV is substantially identical to that of the transistor included in the pixel Px, and therefore, its description will be omitted. In addition, outer lines TL constituting the touch sensor 20 are provided in the first non-display area NA1. Specifically, first outer lines TL1 among the outer lines TL are located on the encapsulation layer SL corresponding to the first non-display area NA1.

In an embodiment, a first dam DAM1 and a second dam DAM2 may be provided at an outermost side of the first non-display area NA1. The first dam DAM1 and the second dam DAM2 may be provided on the second insulating layer INS2. The second dam DAM2 may be formed higher than the first dam DAM1. The first dam DAM1 and the second dam DAM2 may be formed of the same material as the pixel defining layer PDL.

A power supply line ELVSS_L for supplying the second power source ELVSS to the pixels Px is provided in the second non-display area NA2. The power supply line ELVSS_L may be connected to the cathode electrode EL2 of each of the pixels Px.

In an embodiment, the power supply line ELVSS_L may be provided on the first insulating layer INS1. In this case, the power supply line ELVSS_L may be formed of the same material and in the same process as the source electrode SE and the drain electrode DE. In another embodiment, the power supply layer ELVSS_L may be formed in another layer.

However, in another embodiment, when the power supply line ELVSS_L is provided on the first insulating layer INS1, the power supply line ELVSS_L may partially overlap with a signal line of the driving circuit DRV, which is located in the same layer. In such an embodiment, the signal line of the driving circuit DRV may have a bridge structure to avoid contact with the power supply line ELVSS_L.

The power supply line ELVSS_L may be made of a metal. For example, the power supply line ELVSS_L may be made of at least one metal, such as gold (Au), silver (Ag), aluminum (Al), molybdenum (Mo), chromium (Cr), titanium (Ti), nickel (Ni), neodymium (Nd), and copper (Cu), or alloys thereof. In addition, the power supply line ELVSS_L may be formed in a single layer, but the present disclosure is not limited thereto. For example, the power supply line ELVSS_L may be formed in multiple layers in which two or more materials among the metals and the alloys are stacked.

The passivation layer PSV may be provided on the power supply line ELVSS_L. The passivation layer PSV may be an inorganic insulating layer made of an inorganic material. The inorganic material may include polysiloxane, silicon nitride, silicon oxide, silicon oxynitride, and the like.

The second insulating layer INS2 may be provided on the passivation layer PSV. The second insulating layer INS2 may be an organic insulating layer made of an organic material. The organic material may include organic insulating materials including a polyacryl-based compound, a polyimide-based compound, a fluorine-based compound such as Teflon, a benzocyclobutene-based compound, and the like.

A connection pattern CP may be provided on the second insulating layer INS2. The connection pattern CP is connected to the power supply line ELVSS_L through a contact hole passing through the second insulating layer INS2 and through the passivation layer PSV. Here, the connection pattern CP may be formed of the same material and in the same process as the anode electrode EL1.

For example, the connection pattern CP may be made of a metal layer including silver (Ag), magnesium (Mg), aluminum (Al), platinum (Pt), palladium (Pd), gold (Au), nickel (Ni), neodymium (Nd), iridium (Ir), chromium (Cr), and alloys thereof and/or a transparent conductive layer including tin oxide (ITO), indium zinc oxide (IZO), zinc oxide ZnO, and indium tin zinc oxide (ITZO).

The pixel defining layer PDL may be provided on the connection pattern CP. A portion of the cathode electrode EL2 of the pixel Px adjacent to the connection pattern CP extends to the second non-display area NA2, and is electrically connected to the connection pattern CP When viewed on a plane, if the power supply line ELVSS_L and the outer lines TL overlap with each other, the touch performance of the touch sensor 20 may be deteriorated due to a signal delay caused by influence of coupling capacitance generated between the power supply line ELVSS_L and the outer lines TL.

As described above, according to the present disclosure, the overlapping of the power supply line ELVSS_L and the outer lines TL is minimized, so that deterioration of touch performance of the touch sensor 20 can be reduced or prevented by decreasing the coupling capacitance generated between the power supply line ELVSS_L and the outer lines TL.

As described above, according to the present disclosure, the overlapping of the power supply line and the outer lines is reducer or minimized, so that the deterioration of touch performance can be reduced or prevented by decreasing coupling capacitance generated between the power supply line and the outer lines.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth by the following claims and their functional equivalents.

What is claimed is:

1. A display device comprising:
    a substrate corresponding to a display area in which an image is displayed, and a non-display area at at least one side of the display area;
    a touch sensing device at the display area;
    first outer lines electrically connected to the touch sensing device, and located at a first non-display area that is a first portion of the non-display area;
    second outer lines connecting the first outer lines and the touch sensing device;
    a plurality of pixels at the display area;
    a driving circuit at the first non-display area for driving the pixels, and comprising a data driver for supplying a data signal to the pixels through respective data lines;
    a power supply line electrically connected to the pixels and located at a second non-display area that is a second portion of the non-display area; and
    a power supply for supplying power to the pixels through the power supply line,
    wherein the power supply line is separate and distinct from the data lines,
    wherein the power supply line surrounds the display area, and
    wherein the power supplied to the pixels is different from the data signal supplied to the pixels.

2. The display device of claim 1, wherein the first outer lines do not overlap with the power supply line.

3. The display device of claim 1, wherein the second outer lines are connected to the touch sensing device by passing through the second non-display area from the first non-display area.

4. The display device of claim 1, wherein the second non-display area is between the first non-display area and the display area.

5. The display device of claim 1, wherein the power supply line is between the driving circuit and the pixels.

6. The display device of claim 1, wherein the driving circuit comprises a scan driver for supplying a scan signal to the pixels.

7. The display device of claim 6, wherein the driving circuit further comprises a timing controller for controlling the scan driver and the data driver.

8. The display device of claim 1, wherein each of the pixels comprises:
    an active layer on the substrate;
    a gate insulating layer over the active layer;
    a gate electrode on the gate insulating layer;
    a first insulating layer over the gate electrode;
    a source electrode and a drain electrode on the first insulating layer;
    a second insulating layer over the source electrode and the drain electrode;
    an anode electrode on the second insulating layer and connected to the drain electrode;
    an organic layer on the anode electrode; and
    a cathode electrode on the organic layer.

9. The display device of claim 8, wherein the power supply line is electrically connected to the cathode electrodes of the pixels.

10. The display device of claim 8, wherein the power supply line comprises a same material as, and is in a same layer as, the source electrode and the drain electrode.

11. The display device of claim 8, further comprising a connection pattern on the second insulating layer, and having:
    a first side connected to the power supply line; and
    a second side connected to the cathode electrode.

12. The display device of claim 11, wherein the connection pattern comprises a same material as, and is in a same layer as, the anode electrodes.

13. The display device of claim 12, wherein the connection pattern and the anode electrodes are separated from each other.

14. The display device of claim 11, wherein a portion of the cathode electrode of a pixel that is adjacent the connection pattern extends to the second non-display area to be electrically connected to the connection pattern.

15. The display device of claim 1, further comprising an encapsulation layer covering the pixels,
    wherein the touch sensing device and the first outer lines and the second outer lines are on the encapsulation layer.

16. The display device of claim 1, wherein the touch sensing device comprises:
    first sensing electrodes arranged in a first direction;
    first bridge patterns connecting adjacent ones of the first sensing electrodes;

second sensing electrodes arranged in a second direction crossing the first direction; and second bridge patterns connecting adjacent ones of the second sensing electrodes.

17. The display device of claim 1, wherein the touch sensing device is in a mesh form having a structure in which a plurality of conductive lines cross each other.

18. A display device comprising:
- a substrate including a display area, a first non-display area, and a second non-display area between the display area and the first non-display area;
- a pixel at the display area including a first electrode, a second electrode, and an organic layer between the first electrode and the second electrode;
- a touch sensing device at the display area;
- a first outer line connected to the touch sensing device, and located at the first non-display area;
- a second outer line connecting the first outer line and the touch sensing device;
- a driving circuit at the first non-display area for driving the pixel with a data signal transmitted through a data line;
- a power supply line electrically connected to the second electrode and located at the second non-display area, the power supply line supplying power to the pixel, wherein the first outer line overlaps the driving circuit, in a plan view, and wherein the power supply line surrounds the display area.

19. The display device of claim 18, wherein the display area is surrounded by the first non-display area.

20. The display device of claim 18, wherein the driving circuit is in a first direction with respect to the display area, and wherein the power supply line extends in a second direction substantially perpendicular to the first direction between the driving circuit and the display area.

* * * * *